US009165563B2

(12) United States Patent
Sakata

(10) Patent No.: US 9,165,563 B2
(45) Date of Patent: Oct. 20, 2015

(54) CODING DEVICE, CODING METHOD, DECODING DEVICE, DECODING METHOD, AND STORAGE MEDIUM

(71) Applicant: CASIO COMPUTER CO., LTD., Shibuya-ku, Tokyo (JP)

(72) Inventor: Goro Sakata, Tokyo (JP)

(73) Assignee: CASIO COMPUTER CO., LTD., Tokyo (JP)

(*) Notice: Subject to any disclaimer, the term of this patent is extended or adjusted under 35 U.S.C. 154(b) by 270 days.

(21) Appl. No.: 13/727,370

(22) Filed: Dec. 26, 2012

(65) Prior Publication Data
US 2013/0246073 A1 Sep. 19, 2013

(30) Foreign Application Priority Data

Mar. 19, 2012 (JP) .................................. 2012-061881
Jul. 12, 2012 (JP) .................................. 2012-156793

(51) Int. Cl.
| G10L 19/00 | (2013.01) |
| G10L 19/04 | (2013.01) |
| G10H 1/00 | (2006.01) |
| G10L 19/08 | (2013.01) |
| H03M 7/30 | (2006.01) |

(52) U.S. Cl.
CPC .............. G10L 19/04 (2013.01); G10H 1/0041 (2013.01); G10L 19/08 (2013.01); H03M 7/30 (2013.01)

(58) Field of Classification Search
CPC ... G10L 19/00; G10L 19/0017; G10L 19/002; G10L 19/032; G10L 19/167; G10L 21/00; G10L 21/04

USPC .......................... 704/500, 501, 502, 503, 504
See application file for complete search history.

(56) References Cited

U.S. PATENT DOCUMENTS 5,347,478 A     9/1994  Suzuki et al.
5,970,443 A *  10/1999  Fujii ............................. 704/222
(Continued)

FOREIGN PATENT DOCUMENTS

JP   04361296 A   12/1992
JP   05303383 A   11/1993
(Continued)

OTHER PUBLICATIONS

"Japanese Office Action dated Mar. 4, 2014 in counterpart Japanese Application No. 2012-061881".

Primary Examiner — Qi Han
(74) Attorney, Agent, or Firm — Holtz, Holtz, Goodman & Chick PC

(57) ABSTRACT

For respective sampling data of waveform data of sounds to be coded, a prediction residual value is calculated as sampling residual data, and an effective bit length is calculated from this residual waveform data. Then, for the effective bit length data, a maximum effective bit length among processing targets is generated as common effective actual data, and coded data in which this common effective actual data and information indicating the common effective bit length are arranged in a predetermined configuration format are generated. The information included in the coded data is analyzed and each of the plurality of the common effective bit information is extracted. Then, waveform data of the sounds are decoded by performing inverse linear prediction processing from an analysis result on the residual waveform data decompressed by performing bit extension which adds a portion other than the common effective bit length.

18 Claims, 11 Drawing Sheets

(56) References Cited

U.S. PATENT DOCUMENTS

| | | |
|---|---|---|
| 2004/0069118 A1 | 4/2004 | Okazaki et al. |
| 2005/0216262 A1* | 9/2005 | Fejzo .......................... 704/217 |
| 2006/0081118 A1 | 4/2006 | Okazaki et al. |
| 2007/0240556 A1 | 10/2007 | Okazaki et al. |
| 2008/0078280 A1 | 4/2008 | Okazaki et al. |
| 2009/0002207 A1* | 1/2009 | Harada et al. .................. 341/51 |

FOREIGN PATENT DOCUMENTS

| | | |
|---|---|---|
| JP | 7-160267 A | 6/1995 |
| JP | 7-199996 A | 8/1995 |
| JP | 2004126127 A | 4/2004 |

\* cited by examiner

| COMPRESSION MODE | -a2 | a1 | NOTES |
|---|---|---|---|
| 0 | 0 | 0 | PCM |
| 1 | 0 | 1 | DPCM |
| 2 | 0.8 | 0.5 | LINEAR PREDICTION |
| 3 | 0.8 | 0.7 | LINEAR PREDICTION |
| 4 | 0.9 | 1.4 | LINEAR PREDICTION |
| 5 | 0.9 | 1.6 | LINEAR PREDICTION |
| 6 | 1 | 1.8 | LINEAR PREDICTION |
| 7 | 1 | 2 | LINEAR PREDICTION |

FIG.6

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| S | S | S | S | S | S | S | S | S | S | S | M | M | M | M | M | M |
| S | S | S | S | S | S | S | S | S | S | M | M | M | M | M | M | M |
| S | S | S | S | S | S | S | S | S | M | M | M | M | M | M | M | M |
| S | S | S | S | S | S | S | S | M | M | M | M | M | M | M | M | M |
| S | S | S | S | S | S | S | M | M | M | M | M | M | M | M | M | M |
| S | S | S | S | S | S | S | S | M | M | M | M | M | M | M | M | M |
| S | S | S | S | S | S | S | S | S | M | M | M | M | M | M | M | M |
| S | S | S | S | S | S | S | S | S | S | M | M | M | M | M | M | M |
| S | S | S | S | S | S | S | S | S | S | S | M | M | M | M | M | M |
| S | S | S | S | S | S | S | S | S | S | S | M | M | M | M | M | M |
| S | S | S | S | S | S | S | S | S | S | S | M | M | M | M | M | M |
| S | S | S | S | S | S | S | S | S | S | S | S | M | M | M | M | M |
| S | S | S | S | S | S | S | S | S | S | S | S | M | M | M | M | M |
| S | S | S | S | S | S | S | S | S | S | S | S | M | M | M | M | M |
| S | S | S | S | S | S | S | S | S | S | S | M | M | M | M | M | M |
| S | S | S | S | S | S | S | S | S | S | S | S | M | M | M | M | M |
| S | S | S | S | S | S | S | S | S | S | S | S | S | M | M | M | M |
| S | S | S | S | S | S | S | S | S | S | S | S | S | S | M | M | M |

COMMON ERASED PORTION | COMMON EFFECTIVE BIT

FIG.7

| | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| HEADER 1 | COMPRESSION MODE | | | BIT LENGTH | | | | | SOUND VOLUME CORRECTION PARAMETER | | | | | | | | |
| HEADER 2 | reserved | | | | | | | | | | | | | | | | |
| DATA PORTION 0 | 4 | 3 | 2 | 1 | 0 | 5 | 4 | 3 | 2 | 1 | 0 | 5 | 4 | 3 | 2 | 1 | 0 |
| 1 | 3 | 2 | 1 | 0 | 5 | 4 | 3 | 2 | 1 | 0 | 5 | 4 | 3 | 2 | 1 | 0 | 5 |
| 2 | 2 | 1 | 0 | 5 | 4 | 3 | 2 | 1 | 0 | 5 | 4 | 3 | 2 | 1 | 0 | 5 | 4 |
| 3 | 1 | 0 | 5 | 4 | 3 | 2 | 1 | 0 | 5 | 4 | 3 | 2 | 1 | 0 | 5 | 4 | 3 |
| 4 | 0 | 5 | 4 | 3 | 2 | 1 | 0 | 5 | 4 | 3 | 2 | 1 | 0 | 5 | 4 | 3 | 2 |
| 5 | 5 | 4 | 3 | 2 | 1 | 0 | 5 | 4 | 3 | 2 | 1 | 0 | 5 | 4 | 3 | 2 | 1 |
| 6 | 4 | 3 | 2 | 1 | 0 | 5 | 4 | 3 | 2 | 1 | 0 | 5 | 4 | 3 | 2 | 1 | 0 |
| 7 | 3 | 2 | 1 | 0 | 5 | 4 | 3 | 2 | 1 | 0 | 5 | 4 | 3 | 2 | 1 | 0 | 5 |
| 8 | 2 | 1 | 0 | 5 | 4 | 3 | 2 | 1 | 0 | 5 | 4 | 3 | 2 | 1 | 0 | 5 | 4 |
| 9 | 1 | 0 | 5 | 4 | 3 | 2 | 1 | 0 | 5 | 4 | 3 | 2 | 1 | 0 | 5 | 4 | 3 |
| 10 | 0 | 5 | 4 | 3 | 2 | 1 | 0 | 5 | 4 | 3 | 2 | 1 | 0 | 5 | 4 | 3 | 2 |
| 11 | 5 | 4 | 3 | 2 | 1 | 0 | 5 | 4 | 3 | 2 | 1 | 0 | 5 | 4 | 3 | 2 | 1 |
| 12 | 4 | 3 | 2 | 1 | 0 | 5 | 4 | 3 | 2 | 1 | 0 | 5 | 4 | 3 | 2 | 1 | 0 |
| 13 | 3 | 2 | 1 | 0 | 5 | 4 | 3 | 2 | 1 | 0 | 5 | 4 | 3 | 2 | 1 | 0 | 5 |
| 14 | 2 | 1 | 0 | 5 | 4 | 3 | 2 | 1 | 0 | 5 | 4 | 3 | 2 | 1 | 0 | 5 | 4 |
| 15 | 1 | 0 | 5 | 4 | 3 | 2 | 1 | 0 | 5 | 4 | 3 | 2 | 1 | 0 | 5 | 4 | 3 |
| 16 | 0 | 5 | 4 | 3 | 2 | 1 | 0 | 5 | 4 | 3 | 2 | 1 | 0 | 5 | 4 | 3 | 2 |
| 17 | 5 | 4 | 3 | 2 | 1 | 0 | 5 | 4 | 3 | 2 | 1 | 0 | 5 | 4 | 3 | 2 | 1 |
| 18 | 4 | 3 | 2 | 1 | 0 | 5 | 4 | 3 | 2 | 1 | 0 | 5 | 4 | 3 | 2 | 1 | 0 |
| 19 | 3 | 2 | 1 | 0 | 5 | 4 | 3 | 2 | 1 | 0 | 5 | 4 | 3 | 2 | 1 | 0 | 5 |
| 20 | 2 | 1 | 0 | 5 | 4 | 3 | 2 | 1 | 0 | 5 | 4 | 3 | 2 | 1 | 0 | 5 | 4 |
| ⋮ | | | | | | | | | | | | | | | | | |
| 505 | 3 | 2 | 1 | 0 | 5 | 4 | 3 | 2 | 1 | 0 | 5 | 4 | 3 | 2 | 1 | 0 | 5 |
| 506 | 2 | 1 | 0 | 5 | 4 | 3 | 2 | 1 | 0 | 5 | 4 | 3 | 2 | 1 | 0 | 5 | 4 |
| 507 | 1 | 0 | 5 | 4 | 3 | 2 | 1 | 0 | 5 | 4 | 3 | 2 | 1 | 0 | 5 | 4 | 3 |
| 508 | 0 | 5 | 4 | 3 | 2 | 1 | 0 | 5 | 4 | 3 | 2 | 1 | 0 | 5 | 4 | 3 | 2 |
| 509 | 5 | 4 | 3 | 2 | 1 | 0 | 5 | 4 | 3 | 2 | 1 | 0 | 5 | 4 | 3 | 2 | 1 |

FIG.11

| | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| ADRC → 0 | COMPRESSION MODE ||| BIT LENGTH |||| SOUND VOLUME CORRECTION PARAMETER |||||||||
| 1 | reserved |||||||||||||||||
| 2 | 4 | 3 | 2 | 1 | 0 | 5 | 4 | 3 | 2 | 1 | 0 | 5 | 4 | 3 | 2 | 1 | 0 |
| 3 | 3 | 2 | 1 | 0 | 5 | 4 | 3 | 2 | 1 | 0 | 5 | 4 | 3 | 2 | 1 | 0 | 5 |
| 4 | 2 | 1 | 0 | 5 | 4 | 3 | 2 | 1 | 0 | 5 | 4 | 3 | 2 | 1 | 0 | 5 | 4 |
| 5 | 1 | 0 | 5 | 4 | 3 | 2 | 1 | 0 | 5 | 4 | 3 | 2 | 1 | 0 | 5 | 4 | 3 |
| 6 | 0 | 5 | 4 | 3 | 2 | 1 | 0 | 5 | 4 | 3 | 2 | 1 | 0 | 5 | 4 | 3 | 2 |
| 7 | 5 | 4 | 3 | 2 | 1 | 0 | 5 | 4 | 3 | 2 | 1 | 0 | 5 | 4 | 3 | 2 | 1 |

CODING DEVICE, CODING METHOD, DECODING DEVICE, DECODING METHOD, AND STORAGE MEDIUM

This application is based upon and claims the benefit of priority from the prior Japanese Patent Application No. 2012-61881, filed Mar. 19, 2012, and No. 2012-156793, filed Jul. 12, 2012, and the entire contents of which are incorporated herein by reference.

BACKGROUND OF THE INVENTION

1. Field of the Invention

The present application relates to a coding device, a coding method, and a storage medium that can code sound data played by an electronic musical instrument, and to a decoding device, a decoding method, and a storage medium that can decode coded data of sound played by an electronic musical instrument.

2. Related Art

Conventionally, an electronic musical instrument stores, in memory in advance, waveform data for which a sound that is actually performed is recorded in PCM (Pulse Code Modulation) format (hereinafter, referred to as "PCM waveform data"), and when an operation of musical performance is made, it generates a sound by employing the PCM waveform data as a sound source.

Since such an electronic musical instrument may generate a sound in a plurality of channels simultaneously, semiconductor memory that can be accessed at a high speed is equipped as memory for PCM waveform data. Since such semiconductor memory increases in cost with its capacity increasing, it is necessary to save cost by decreasing its capacity. Therefore, PCM waveform data is not stored in semiconductor memory as it is, but rather is stored in semiconductor memory in a state in which the data is coded and its data volume is compressed.

Furthermore, such an electronic musical instrument generating a sound in a plurality of channels simultaneously leads to increase in processing load on hardware. Therefore, in regard to a coding method, although it is necessary to decrease processing load on hardware, a format in which sound quality deterioration occurs is not appropriate. That is to say, in regard to a coding method, a method that can achieve both a reduction in processing load on hardware as well as a decrease in sound quality deterioration has been demanded.

Furthermore, in addition to the curbing the memory capacity as stated above, another purpose of coding is to increase the number of channels generating a sound simultaneously in an electronic musical instrument. Memory has a maximum transfer data rate and this maximum transfer data rate determines the number of channels generating sound simultaneously. Therefore, for coding of PCM waveform data, if it is possible to decrease the data transfer amount per channel, it becomes possible to generate sound simultaneously in more channels.

In this regard, Japanese Unexamined Patent Application, Publication No. H07-160267 discloses a waveform data coding device that expresses an amplitude value of a waveform or a differential value thereof with floating point data consisting of a fixed-point part and an exponent part, standardizes exponent parts corresponding to a predetermined number of consecutive fixed-point parts by a value of one exponent part, and embeds a compressed exponent part thus obtained or a differential compressed exponent part, which is a differential value thereof, as a portion of bit data of the fixed-point part and then outputs as coded data.

Furthermore, Japanese Unexamined Patent Application, Publication No. H07-199996 discloses a waveform data coding device that expresses an amplitude value of a waveform or a difference value thereof with floating point data consisting of a fixed-point part and an exponent part, standardizes exponent parts corresponding to a predetermined number of the consecutive fixed-point parts by a value of an exponent part as appropriate, and furthermore outputs a compressed exponent part or a difference compressed exponent part, which is a difference value of the exponent part, or a difference exponent part as data coded along with the fixed-point part.

The waveform data coding devices according to Japanese Unexamined Patent Application, Publication No. H07-160267 and Japanese Unexamined Patent Application, Publication No. H07-199996 store an exponent part of floating point data by finite difference and standardize exponent parts corresponding to a predetermined number of consecutive fixed-point parts by a value of one exponent part. The coding of these waveform data coding devices incur less processing load on hardware as well as less deterioration in sound quality.

Incidentally, there has been a need for electronic musical instruments with high-quality sound recently. Therefore, in terms of coding with a constant bit rate in which the bit rate is always constant, when a waveform of sound changes abruptly at an attack part of a piano sound, for example, the bit rate may not be sufficient in order to maintain a certain level of sound quality. This phenomenon may occur in the waveform data coding device according to Japanese Unexamined Patent Application, Publication No. H07-160267 and Japanese Unexamined Patent Application, Publication No. H07-199996. Therefore, there has been a need for realizing coding and decoding that can decrease processing load on hardware as well as can maintain high-quality sound even when a waveform of sound changes abruptly.

SUMMARY OF THE INVENTION

The present invention has been made by taking such demands into account, and has an object of enabling coding that maintain high-quality sound even when a waveform of sound changes abruptly, while decreasing processing load on hardware.

Furthermore, the present invention has been made by taking such demands into account, and has an object of properly decoding coded sound data so as to be able to maintain high-quality sound even when a waveform of a sound changes abruptly, while decreasing processing load to hardware.

In order to achieve the abovementioned objects, one aspect of a coding device of the present invention is characterized by including:

a residual waveform data generator for calculating a residual value as sampling residual data for each set of sampling data of waveform data for sound to be coded, and generating a time-series assembly of the sampling residual data as residual waveform data;

an effective bit length data generator for calculating an effective bit length for each set of sampling residual data of the residual waveform data generated by the residual waveform data generator, and generating effective bit length data indicating the effective bit length of each set of sampling residual data of the residual waveform data;

a common effective bit length retrieving unit for retrieving a maximum effective bit length as a common effective bit length, with each effective bit length of a predetermined number of sets of sampling residual data as a processing target, for the effective bit length data generated by the effective bit length data generator, and generating, as the predetermined number of common effective actual data, data in which a portion other than the common effective bit length is erased from each of the predetermined number of sets of sampling residual data; and a configuration format arranger for generating, as coded data, data in which the predetermined number of common effective actual data generated by the common effective bit length retrieving unit and information indicating the common effective bit length are at least arranged in a predetermined configuration format. Furthermore, one aspect of a decoding device of the present invention is characterized by including:

memory that stores coded data which is data, in which information of a plurality of common effective bits, information indicating a common effective bit length, and information indicating a prediction coefficient that constitute sampling residual data calculated by linear prediction processing using the prediction coefficient for each set of sampling data of waveform data for sound, are at least arranged in a predetermined configuration format;

a configuration format analysis unit that analyzes the arrangement of the information of the plurality of common effective bits, the information indicating a common effective bit length, and the information indicating the prediction coefficient from the configuration format of the coded data;

a common effective bit extraction unit for obtaining information indicating the common effective bit length from an analysis result by the configuration format analysis unit, and extracting the information of the plurality of common effective bits, respectively based on the information indicating the common effective bit length;

a residual waveform data decompression unit for decompressing the residual waveform data by performing bit extension, which adds a portion other than the common effective bit length, to the information of the plurality of common effective bits extracted by the common effective bit extraction unit, respectively; and an inverse linear prediction processing unit for performing inverse linear prediction processing by the prediction coefficient snecified from an analysis result by the configuration format analysis unit on the residual waveform data decompressed by the residual waveform data decompression unit, so as to decode waveform data for the sound.

BRIEF DESCRIPTION OF THE DRAWINGS

FIG. 6 is a view showing one example of a result of processing executed by a common effective bit length retrieving unit;

FIG. 7 is a schematic view showing blocks of a configuration format in which a common effective bit length is 6 bit;

FIG. 11 is a view showing an example of bit locations BITC showing each LSB location of common effective bits to be extracted;

DETAILED DESCRIPTION OF THE INVENTION

Hereinafter, embodiments of the present invention will be explained with reference to the drawings.

An audio data processing system obtains the sound of an instrument that is actually played as PCM waveform data, and generates and stores coded data by coding the PCM waveform data thus obtained. Then, the audio data processing system decodes the coded data stored, in response to an output request, so as to decompress and output the PCM waveform data.

Figure 1:
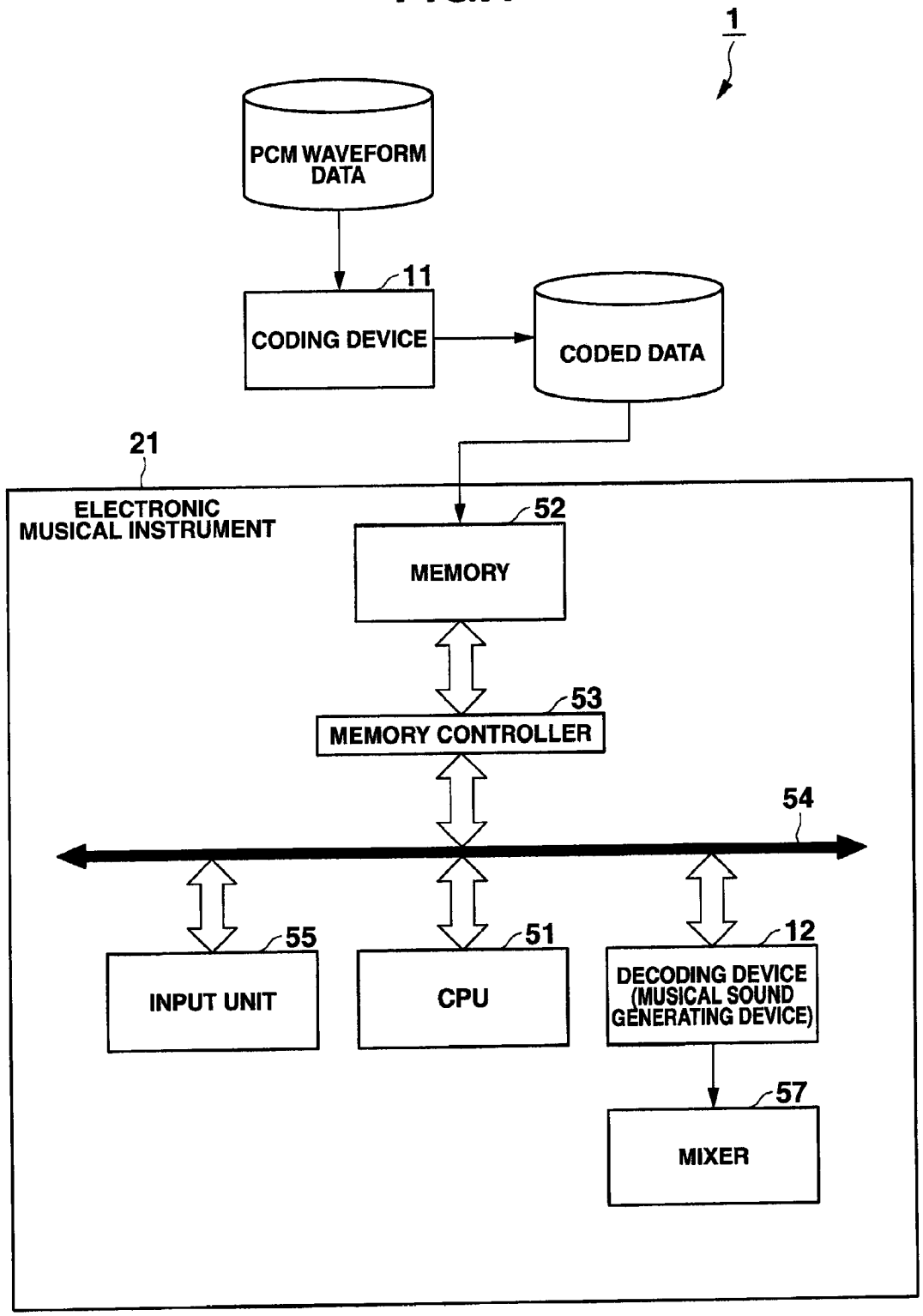
FIG. 1 is a block diagram showing a configuration of an audio data processing system including an embodiment of the present invention.

FIG. 1 is a block diagram showing a configuration of an audio data processing system including an embodiment of the present invention.

As shown in FIG. 1, an audio data processing system 1 includes a coding device 11, and an electronic musical instrument 21 that has a decoding device 12.

The coding device 11 codes PCM waveform data so as to generate coded data as data made by conducting lossless pression the PCM waveform data.

The decoding device 12 decompresses the PCM waveform data by decoding the coded data generated by the coding device 11.

The decoding device 12 is embedded in the electronic musical instrument 21 such as an electronic piano (configured as a musical sound generating device 12 as described later) in the present embodiment. "PCM waveform data", which is a target for decoding this case, refers to a time-series assembly of sampling data that is obtained as a result of sound of a certain scale generated from an instrument corresponding to the electronic musical instrument 21 being digitalized with a predetermined sampling cycle. For example, if the instrument is a piano, PCM waveform data is generated from the sound generated when pressing its keyboard.

In the decoding device 12, coded data is stored in advance in each scale (each key), and when an output instruction of a sound with a certain scale (a pressing operation of a key to which the certain scale is assigned) is made, PCM waveform data with the certain scale is decompressed by obtaining and decoding the coded data with the certain scale. Then, the decoding device 12 generates a sound with the certain scale based on the PCM waveform data.

As described above, the coded data obtained by the PCM waveform data subjected to lossless compression by the coding device 11 is stored in advance in the decoding device 12. In this way, it is possible to curb the memory capacity of the decoding device 12 (memory capacity of the electronic musical instrument 21). When an output instruction (a pressing operation of a key and the like) is made to the decoding device 12, the coded data is decoded to decompress a large volume of the PCM waveform data so as to enable playback. In this way, it is possible for the electronic musical instrument 21 provided with the decoding device 12 to replay high-quality sound.

In order to facilitate an understanding of the decoding device 12 according to the present embodiment, coded data, which is a target for decoding by the decoding device 12, will be explained first.

As described above, the coded data is generated by the coding device 11.

Figure 2:
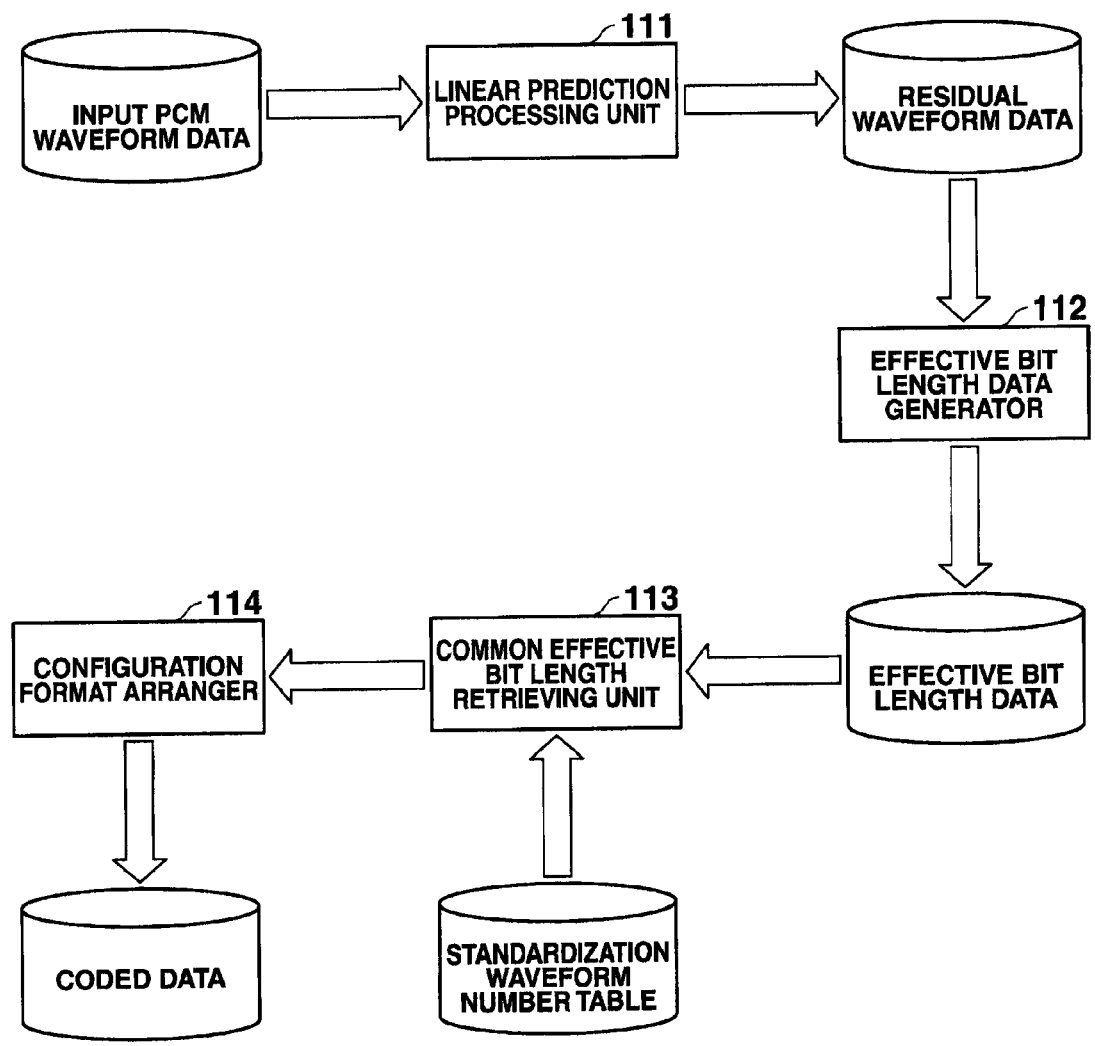
FIG. 2 is a functional block diagram showing a functional configuration for executing coding processing, among the functional configurations of a coding device.

FIG. 2 is a functional block diagram showing a functional configuration for executing coding processing, among the functional configurations of the coding device 11.

As shown in FIG. 2, the coding device 11 includes a linear prediction processing unit 111, an effective bit length data generator 112, a common effective bit length retrieving unit 113, and a configuration format arranger 114.

The linear prediction processing unit 111 generates residual waveform data by performing linear prediction processing on the PCM waveform data inputted.

"Linear prediction processing" refers to a series of processing of repeating the processing of subtracting, from one sampling data inputted among the PCM waveform data, data in which a predetermined linear prediction coefficient has been multiplied by several past sampling data so as to generate data indicating a linear prediction residual value (hereinafter, referred to as "sampling residual data"), thereby generating a time-series assembly of sampling residual data (hereinafter, referred to as "residual waveform data").

Further detailed functional configuration of the linear prediction processing unit 111 will be explained below.

Figures 3, 4:
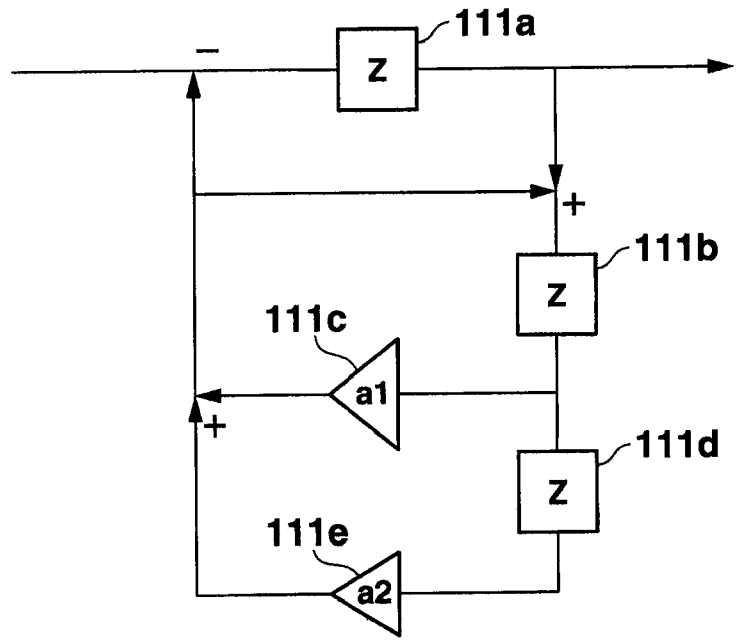
FIG. 3 is a functional block diagram showing one example of a detailed functional configuration of the linear prediction processing unit in FIG. 2.
FIG. 4 is a table illustrating a compression mode table of a coding device according to the present embodiment.

FIG. 3 is a functional block diagram showing one example of a detailed functional configuration of the linear prediction processing unit 111 of FIG. 2.

As shown in FIG. 3, the linear prediction processing unit 111 includes delay circuits 111a, 111b, and 111d, and multipliers 111c and 111e.

The linear prediction processing unit 111 subtracts the respective output data of the multipliers 111c and 111e from sampling data inputted among the PCM waveform data so as to generate sampling residual data.

Then, the linear prediction processing unit 111 outputs by delaying by one sampling cycle at the delay circuit 111a to output it.

The respective output data of the multipliers 111c and 111e is added to the sampling residual data, and the sampling residual data is inputted to the delay circuit 111b.

After the sampling residual data is delayed by one sampling cycle at the delay circuit 111b, the sampling residual data is inputted to the multiplier 111c and the delay circuit 111d, respectively.

In the multiplier 111c, the data inputted from the delay circuit 111b is multiplied by a linear prediction coefficient a1 of a compression mode, and then outputted.

On the other hand, in the delay circuit 111d, the data inputted from the delay circuit 111b is further delayed by one sampling cycle and outputted to the multiplier 111e.

In the multiplier 111e, the data inputted from the delay circuit 111d is multiplied by a linear prediction coefficient a2 of compression mode, and then outputted.

For linear prediction processing of the present embodiment, the linear prediction processing unit 111 generates various kinds of residual waveform data using each of various kinds of linear prediction coefficients per sampling data of the PCM waveform data, and selects and outputs the most appropriate one thereamong as sampling residual waveform data used for subsequent linear prediction processing.

Here, various kinds of "linear prediction coefficients" are provided in advance in the present embodiment. Furthermore, each of the various kinds of linear prediction coefficients respectively corresponds to each of the various kinds of compression modes, respectively. That is to say, a compression mode is information for identifying a specific one among the various kinds of linear prediction coefficients.

FIG. 4 is a table illustrating a compression mode table of the coding device according to the present embodiment The compression mode table is stored in the coding device 11 advance, and pairs of the different linear prediction coefficients a1 and a2 are stored therein to be associated with values indicating kinds of the various compression modes.

In addition, in a compression mode 0, PCM waveform data is compressed to generate residual waveform data, and when the residual waveform data is demodulated, the original PPM waveform data is reproduced.

In a compression mode 1, the PCM waveform data is compressed to generate residual waveform data, and when the residual waveform data is demodulated, DPCM (differential pulse code modulation) waveform data is reproduced.

Furthermore, in either one of compression modes 2 to the PCM waveform data is compressed to generate residual waveform data, and when the residual waveform data is demodulated, linear prediction waveform data is reproduced.

More specifically, in the compression mode 2, based on two waveform data sets obtained by each of the linear prediction coefficients a1 and a2, a prediction is performed by a curve line approaching a side of a peak value 0, and linear prediction waveform data is reproduced.

In the compression mode 7, linear prediction waveform data is reproduced so that a prediction value is set to be on a linear extension of two waveform data sets obtained by each the linear prediction coefficients a1 and a2.

It should be noted that, in the present embodiment, residual waveform data still can be generated even when simplifying the linear prediction processing unit 111 or omitting the multipliers 111c and 111e so long as the compression mode is 0, 1, or 7.

Referring back to FIG. 2, the effective bit length data generator 112 generates effective bit length data, which is time-series data indicating of the respective effective bit lengths for the residual waveform data generated by the linear prediction processing unit 111.

Here, "effective bit length" in the present embodiment refers to a bit length of data necessary to maintain a predetermined sound quality in the process of coding and decoding.

FIG. 5 is a view showing one example of various data processed in the coding device 11 according to the present embodiment.

Figure 5A:
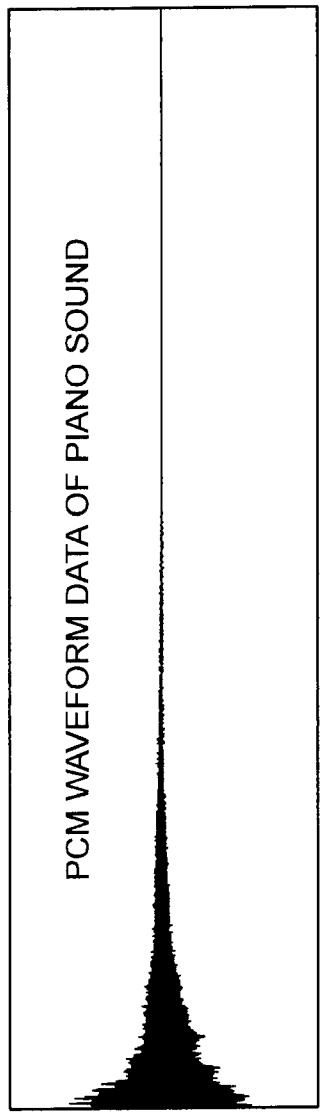
FIG. 5A is a view showing an example of various data processed in a coding device according to the present embodiment, and showing one example of PCM waveform data of an original piano sound.
Figure 5B:
FIG. 5B is a view showing an example of various data processed in a coding device according to the present embodiment, and showing one example of residual waveform data generated from the PCM waveform data of FIG. 5A.
Figure 5C:
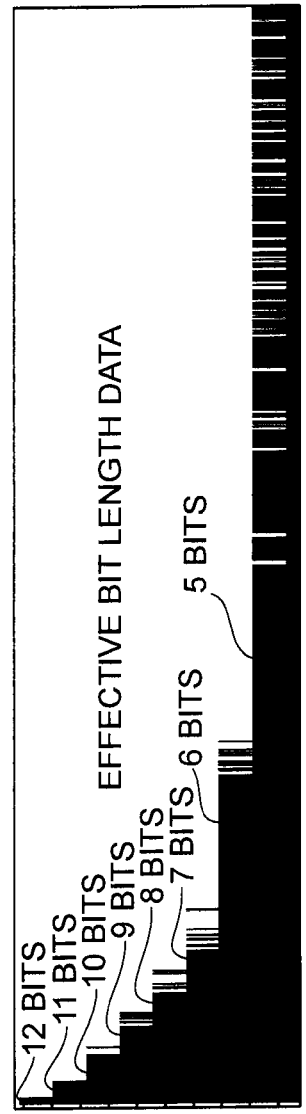
FIG. 5C is a view showing an example of various data processed in a coding device according to the present embodiment, and showing one example of effective bit length data generated from the residual waveform data of FIG. 5B.

Specifically, FIG. 5A is a view showing one example of PCM waveform data of an original piano sound. FIG. 5B is a view showing one example of residual waveform data generated from the PCM waveform data of FIG. 5A. FIG. 5C is a view showing one example of effective bit length data generated from the residual waveform data of FIG. 5B.

The linear prediction processing unit 111 performs linear prediction processing as described above from input PCM waveform data shown in FIG. 5A, thereby outputting residual waveform data as shown in FIG. 5B.

The effective bit length data generator 112 generates effective bit length data in the residual waveform data as shown in FIG. 5C. That is to say, according to the example of FIG. 5C, the effective bit length tends to gradually decrease from 12 bits to 11 bits, 10 bits, 9 bits, 8 bits, 7 bits, 6 bits, and to 5 bits over time from the time of starting generating a sound.

Referring back to FIG. 2, the common effective bit length retrieving unit 113 refers to a standardization waveform number table and retrieves the maximum effective bit length among the respective effective bit lengths of a predetermined number of consecutive sampling residual data as a common effective bit length, for the effective bit length data generated by the effective bit length data generator 112.

Here, "a standardization waveform number table" is a table in which the number of residual waveforms, block time ms, and bit rate bps are arranged to be associated with each of various kinds of common effective bit lengths. It should be noted that the number of residual waveforms refers to the number of sampling residual data (more properly, a common effective bit as described later; that can be stored in a block of memory capacity set beforehand (for example, 1024 byte). The block time refers to a replay time during which the block is decoded and sound is replayed.

Furthermore, the common effective bit length retrieving unit 113 leaves data corresponding to a common effective bit length (hereinafter, referred to as "common effective bit") among the predetermined number of consecutive each set of sampling residual data that constitutes the residual waveform data, and erases data other than the data corresponding to a common effective bit length (hereinafter, the erased portion is referred to as "common erased portion").

FIG. 6 is a view showing one example of a result of processing executed by the common effective bit length retrieving unit 113.

In the example of FIG. 6, a bit length of sampling residual data stored in a single row is set to be 17 bit. That is to say, in the example of FIG. 6, a single row is composed of 17 small blocks, and a predetermined bit is stored in these small blocks. For blocks stored in these small blocks, there are coded bits shown by "S" and bits of actual data shown by "M".

An effective bit length of one sampling residual data is, in order from the 0 bit position on the right side, the sum of an actual data bit length denoted by "M" and a bit length denoted by one "S" (the rightmost "S" in each row). In the example of FIG. 6, blank portions cut a hatched line each row represent a portion of an effective bit length of sampling residual data.

This effective bit length differs depending on each set of sampling residual data (each row) included in the overall blocks. Therefore, the maximum effective bit length among the effective bit lengths of each set of sampling residual data (each row) included in the overall blocks (in the example of FIG. 6, 11 bit in the fifth row from the top) is set to be a common effective bit. Then, redundant bits other than those are erased as a common erased portion.

Referring back to FIG. 2, the configuration format arranger 114 generates, as coded data, data in which information of a plurality of consecutive common effective bits, information indicating a common effective bit length, and information indicating a compression mode that are left by the common effective bit length retrieving unit 113 are at least arranged in a predetermined configuration format.

Here, in the present embodiment, "configuration format" refers to a format that can be read by the decoding device 12 (a musical sound generating device 12 in the present embodiment), and is composed of a header portion and a data portion, for example. In the header portion, data indicating a common effective bit length, data indicating a compression mode for identifying a linear prediction coefficient used for generating residual waveform data by the linear prediction processing unit 111, and the like are arranged. In the data portion, information of a plurality of consecutive common effective bits is arranged in a time-series manner without any space.

FIG. 7 is a schematic view showing blocks of a configuration format in which a common effective bit length is 6 bit.

As shown in FIG. 7, a block of the configuration format is a block of which the memory capacity is 1024 bytes, and is configured to include a 4-byte header portion and 1020-byte data portion.

In the header portion, "compression mode" used when generating sampling residual data stored in the block, "bit length" indicating a common effective bit length, and "sound volume correction parameter" indicating a parameter of sound volume correction are arranged. Furthermore, "reserved" is provided in the header portion so that arbitrary data can be arranged therein in the future.

In the data portion, information of a plurality of consecutive common effective bits is arranged in a time-series manner without any space.

For PCM waveform data inputted, a plurality of blocks is repeatedly generated in a time-series manner. That is to say, an assembly of groups of a plurality of blocks is coded data for PCM waveform data inputted.

The coded data thus generated is data that does not leave data of constant bit length, but rather leaves, as a common effective bit, data of a common effective bit length necessary for maintaining sound quality which changes depending on the variety of sounds or time positions. In this way, it becomes possible to lower a bit rate without deteriorating sound quality in coded data.

Next, a configuration example for the case in which the decoding device 12 for decoding coded data generated as described above is applied as a musical sound generating device of the electronic musical instrument 21 will be explained.

It should be noted that the decoding device 12 is hereinafter referred to as a "musical sound generating device 12" as appropriate. That is to say, the musical sound generating device 12 of the present embodiment is configured as a device that allows the electronic musical instrument 21 realized as a keyboard instrument such as an electronic piano to generate a musical sound from a sound source.

First, a block showing a hardware configuration of an electronic musical instrument 21 having such a musical sound generating device 12 will be explained.

As shown in FIG. 1, the electronic musical instrument 21 includes a CPU (Central Processing Unit) 51, memory 52 composed of ROM (Read Only Memory), RAM (Random Access Memory), and the like, a memory controller 53, a bus 54, an input unit 55, and a mixer 56, in addition to the decoding device 12 as described above.

The CPU 51 executes various processing in accordance with programs stored in the ROM in the memory 52. For example, the CPU 51 executes the processing for allowing the musical sound generating device 12 to generate a sound corresponding to a key pressing operation inputted through the input unit 55 composed of a keyboard and executes the processing relating to settings of the electronic musical instrument 21 inputted by a user.

Furthermore, data necessary for the CPU 51 and the musical sound generating device 12 to execute various processing is stored in the RAM in the memory 52 as appropriate. That is to say, this RAM is set to be common memory shared by each functional unit of the overall electronic musical instrument 21. More specifically, parameters and the like used when the CPU 51 executes various processing such as screen display are stored in the RAM.

The memory controller 53 controls access to the memory by the CPU 51 and the musical sound generating device 12. More specifically, the memory controller 53 operates as a bus slave with respect to the CPU 51 or the musical sound generating device 12 that operates as a bus master, and reads data from a designated address in response to a request from a bus master.

The CPU 51 and the memory 52 are mutually connected via the bus 54. This bus 54 is also connected to the input unit 55 and the musical sound generating device 12.

The input unit 55 includes a keyboard and switches for inputting various information. Then, when a key is pressed, the input unit 55 outputs a key number for identifying the key or information indicating the intensity of key pressing to the CPU 51 and outputs various information inputted by the user to the CPU 51.

Besides this, this electronic musical instrument 21 may include a display device, a speaker, DAC, and the like for outputting images and sounds. Furthermore, a hard disk, DRAM (Dynamic Random Access Memory), and the like that store various programs and data for controlling the electronic musical instrument 21 may be added to the electronic musical instrument 21.

The musical sound generating device 12 as an embodiment of the decoding device according to the present invention reads coded data stored in the memory 52 in response to the instruction of the CPU 51 and performs decoding processing on the coded data so as to generate the resulting PCM waveform data as musical sound.

Furthermore, the musical sound generating device 12 includes a data register, a counter, and the like that temporarily stores coded data read from the memory 52. This will be described in detail later with reference to FIG. 10.

The mixer 56 synthesizes the musical sound generated by the musical sound generating device 12 and outputs to DAC or the like (not shown). This DAC converts a digital signal representing the musical sound inputted from the mixer 56 to an analogue signal and outputs to a speaker or the like.

The electronic musical instrument 21 thus configured obtains from the memory coded data corresponding to a key that is pressed by a player (an operator of the electronic musical instrument 21) pressing a predetermined key. Then, the electronic musical instrument 21 performs decoding processing on the coded data thus obtained so as to decode the PCM waveform data. Afterward, the electronic musical instrument 21 generates an analogue signal for output based in the decoded PCM waveform data and outputs a musical sound with a tone assigned to the key that was pressed, to the speaker or the like.

Figure 8:
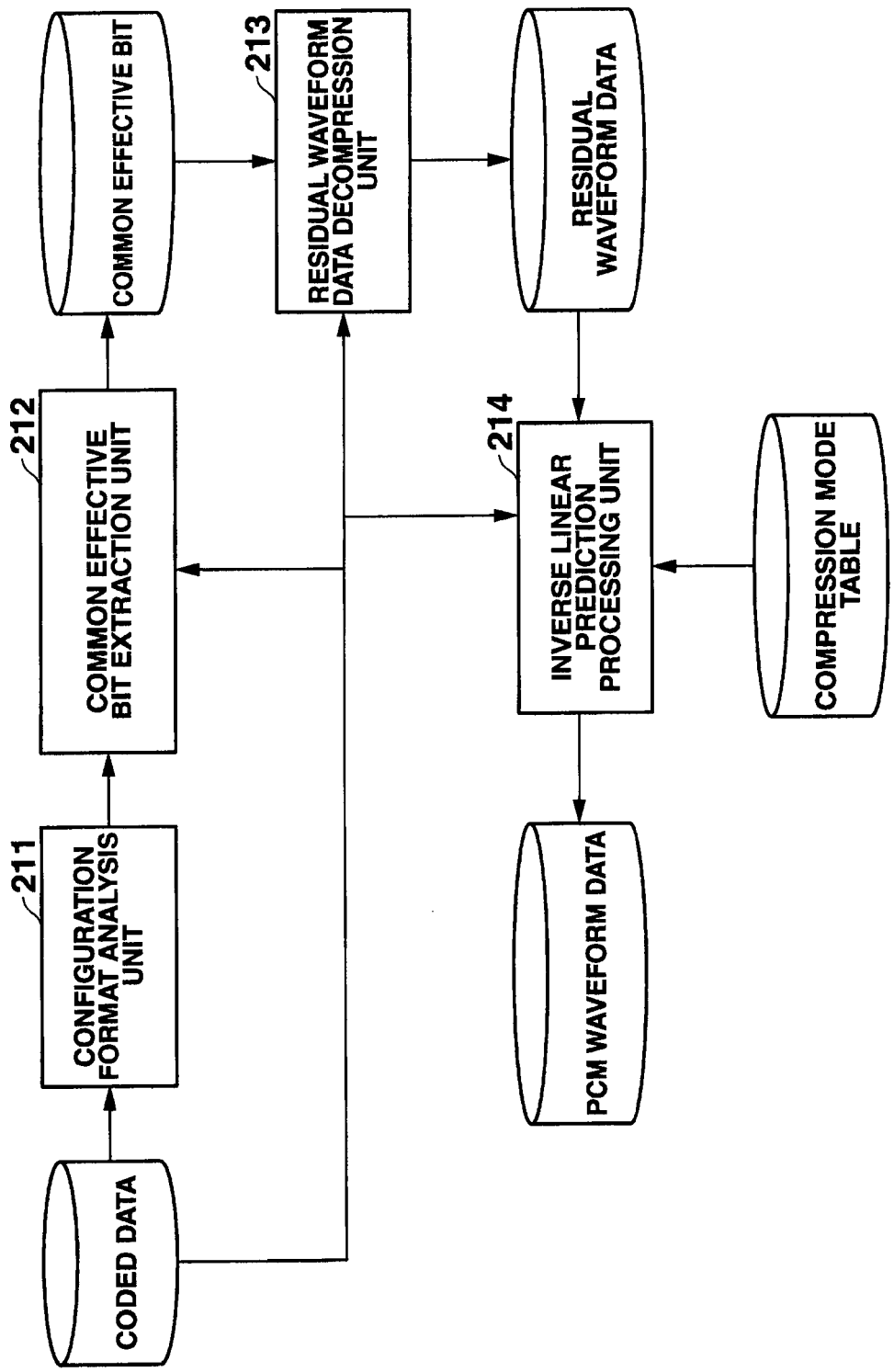
FIG. 8 is a functional block diagram showing a functional configuration that executes decoding processing, among the functional configurations of a musical sound generating device of FIG. 1.

FIG. 8 is a functional block diagram showing a functional configuration that executes decoding processing, among the functional configurations of the musical sound generating device 12 of FIG. 1.

In a case in which the musical sound generating device 12 of the electronic musical instrument 21 performs decoding processing, as shown in FIG. 8, a configuration format analysis unit 211, a common effective bit extraction unit 212, a residual waveform data decoding decompression unit 213, and an inverse linear prediction processing unit 214 function.

The configuration format analysis unit 211 analyzes a block to be decoded among a plurality of blocks constituting the coded data (see FIG. 7). More specifically, the configuration format analysis unit 211 analyzes information such as "compression mode", "bit length", and the like from the header portion of the block, and analyzes an address of a common effective bit stored in the data portion and the like.

The common effective bit extraction unit 212 sequentially extracts, in a time-series manner, information of a plurality of consecutive common effective bits (see FIG. 6) from data of a block to be extracted based on an analysis result of the configuration format analysis unit 211.

The residual waveform data decompression unit 213 specifies a common bit length from the information of "bit length" that is analyzed by the configuration format analysis unit 211 and performs bit extension on each of the information of a plurality of consecutive common effective bits based on the common bit length (addition of a bit corresponding to a common erased portion), thereby decompressing a predetermined number of consecutive respective sampling residual data, i.e. residual waveform data.

The inverse linear prediction processing unit 214 performs inverse linear prediction processing on the residual waveform data thus decompressed, thereby decompressing the PCM waveform data (more accurately, a portion corresponding to a block therein).

Here, "inverse linear prediction processing" refers to an inverse operation of linear prediction processing in coding processing. Therefore, as the inverse linear prediction Processing, it is necessary to use the same linear prediction coefficient as that specified in the compression mode used in the coding processing. For this reason, as shown in FIG. 8, the same compression mode table as that of the coding device 11 (refer to FIG. 4) is stored in advance in the memory for the musical sound generating device 12 (the decoding device 12). Therefore, the inverse linear prediction processing unit 214 specifies the linear prediction coefficient used in the coding processing from "a compression mode" that is analyzed by the configuration format analysis unit 211 and the compression mode table, and performs inverse linear prediction processing using the linear prediction coefficient.

Figure 9:
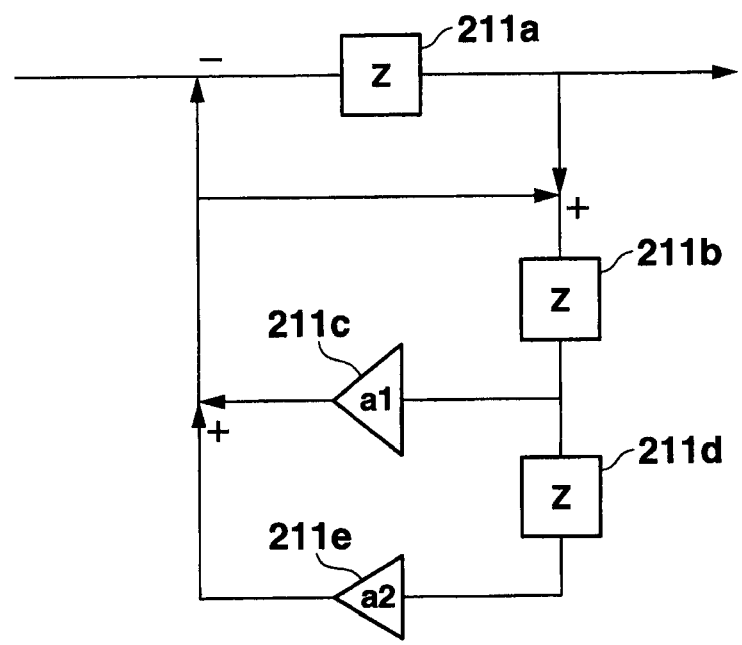
FIG. 9 is a functional block diagram showing one example a detailed functional configuration of a inverse linear prediction processing unit in FIG. 8.

FIG. 9 is a functional block diagram showing one example of a detailed functional configuration of the inverse linear prediction processing unit 214 of FIG. 8.

As shown in FIG. 9, the inverse linear prediction processing unit 214 sequentially inputs as input data each set of sampling residual data that is sequentially decompressed. The inverse linear prediction processing unit 214 multiplies each output data of the multipliers 211c and 211e with input data so as to decompress one sampling data set in the PCM waveform data.

Then, the inverse linear prediction processing unit 214 outputs by delaying by one sampling cycle at the delay circuit 211a.

Each output data of the multipliers 211c and 211e is added to the sampling data, and the sampling data is inputted to the delay circuit 211b. After the sampling data is delayed by one sampling cycle at the delay circuit 211b, the sampling data is inputted to the multiplier 211c and the delay circuit 211d, respectively.

In the multiplier 211c, the data inputted from the delay circuit 211b is multiplied by a linear prediction coefficient a1 of compression mode, and then outputted.

On the other hand, in the delay circuit 211d, the data inputted from the delay circuit 211b is further delayed by one sampling cycle and outputted to the multiplier 211e.

In the multiplier 211e, the data inputted from the delay circuit 211d is multiplied by a linear prediction coefficient a2 of compression mode, and then outputted.

Next, a flow of decoding processing in the musical sound generating device 12 will be explained.

Figure 10:
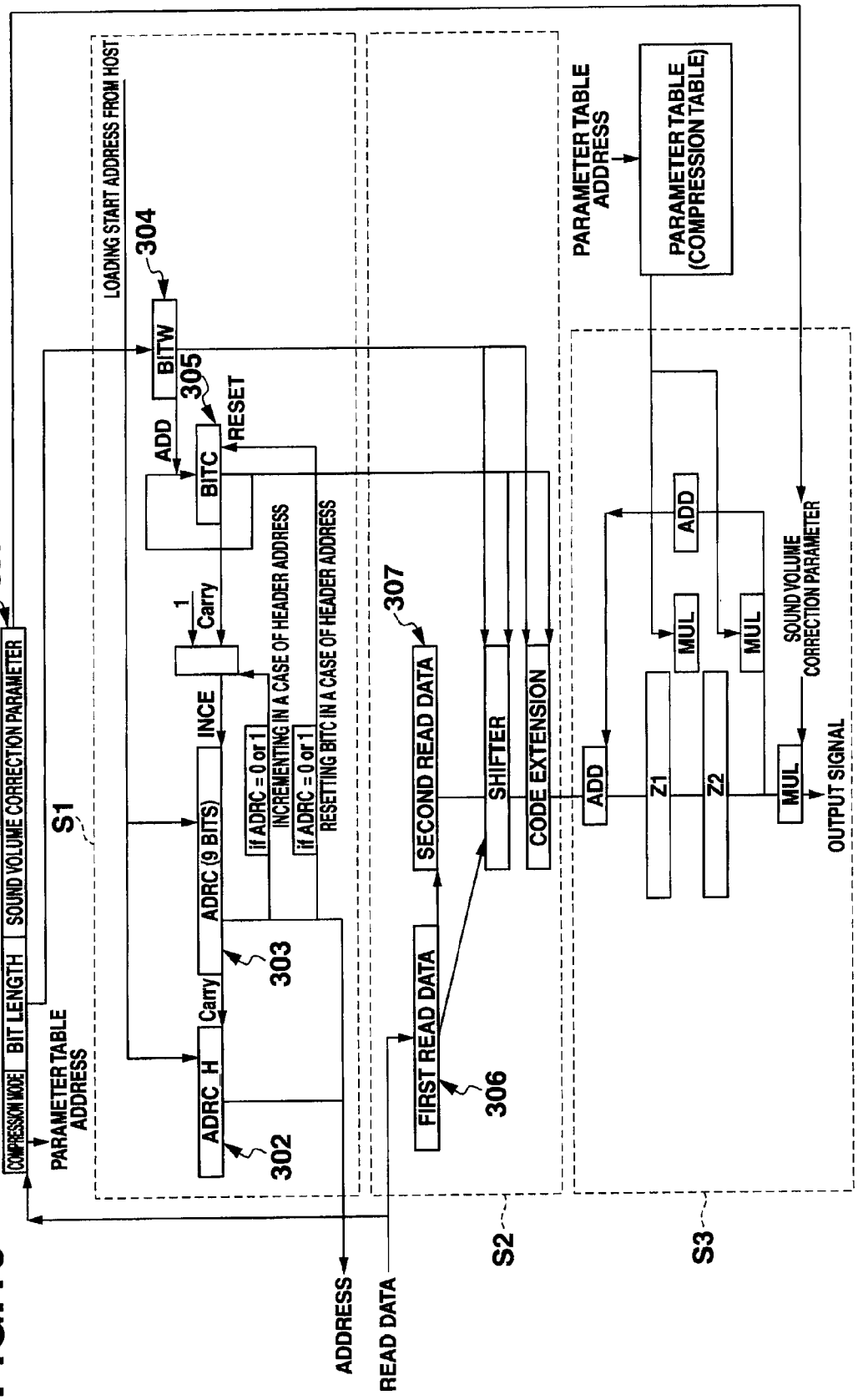
FIG. 10 is a flow chart showing a flow of decoding processing in the musical sound generating device of FIG. 1.

FIG. 10 is a flow chart showing a flow of decoding processing in the musical sound generating device 12.

In the present embodiment, the decoding processing of the musical sound generating device 12 is roughly divided into three steps (Steps S1 to S3) as shown in FIG. 10.

As described above, the decoding processing is performed with each block that constitutes the coded data being sequentially set as a processing unit. In the block to be processed, a header portion and a data portion are provided where the header portion stores various information of "compression mode", "bit length", and "sound volume correction parameter" and the data portion stores information of a plurality of common effective bits that are aligned with each other.

In the block to be processed for processing of coded data, Step S1 is a step of specifying an address of the data portion for respectively extracting information of a plurality of consecutive common effective bits based on information of "bit length" of the header portion, i.e. a common bit length.

Step S2 is a step of sequentially extracting respective information of a plurality of consecutive common effective bits based on an address in the data portion specified in Step S1 and sequentially performing bit extension to each of the common effective bits, thereby decompressing a predetermined number of consecutive each set of sampling residual data, i.e. residual waveform data.

Step S3 is a step of performing the inverse linear prediction processing on residual waveform data that is decompressed in Step S2.

In the following, the details of the respective processing from Steps S1 to S3 will be explained individually in that order.

The following explanations refer to a register, a counter, or the like shown in FIG. 10. Although not illustrated in FIG. 1 or FIG. 8, they are provided beforehand in the decoding device (the musical sound generating device 12).

In a case in which the register and the counter need to be separately distinguished, the reference symbols shown in FIG. 10 are used for explanations thereof. Furthermore, arrows respectively described as "address" and "read data" shown on the left side of FIG. 10 are connected to the memory 52 in which coded data (file) is stored.

That is to say, the arrow shown as "address" indicates designating an address of a data portion including a common effective bit to be extracted in the block to be decoded. Furthermore, the arrow shown as "read data" indicates that data (word unit) extracted (read) from the address is supplied to the decoding device (musical sound generating device). Furthermore, the arrow shown as "loading a start address from CPU" shown on the right side of FIG. 10 indicates that a replay start address (hereinafter, referred to as "start address") of a plurality of coded data (waveform data) stored in the memory 52 is set by the CPU 51, which is a host.

Furthermore, "output signal" shown in the lower portion of FIG. 10 indicates linear PCM waveform data obtained by the present decoding processing.

Here, each block that constitutes the coded data is composed of 1024 bytes as shown in FIG. 7, and the address arrangement is an address that is dividable by 1024. Furthermore, the start address is an initial address of a block.

With such a prerequisite, the following sequence of processing is performed as processing of Step S1.

Initially, a start address is set from the CPU 51, which is a bus host.

More specifically, for a start address, an address ADRC_H higher than a block, and an address-in-block ADRC are set. In the example of FIG. 10, the address ADRC_H higher than a block is stored in the counter 302, and the address-in-block ADRC is stored in the counter 303. Since the start address is an initial address of a block, "0" is stored in the counter 303 as the ADRC, which is in a block.

Since the ADRC, which is in a block, is "0" in this way, the configuration format analysis unit 211 reads information of the header portion which is located at the head of the block to be processed for processing of coded data into the register 301. That is to say, various information of "compression mode", "bit length", and "sound volume correction parameter" is stored in the register 301.

Here, the configuration format analysis unit 211 specifies information of "bit length" from the register 301 and stored it as a common bit length BITW in the register 304.

The configuration format analysis unit 211 stores a bit location BITC in the counter 305. Here, the bit location BITC indicates a waveform bit location of a data portion of a block to be extracted (a location within one word).

The counter 305 that stores the bit location BITC is reset by "0" or "1" indicating a header portion by the address-in-block ADRC. The counter 305 is incremented in a case of being other than "0" or "1" (other than a header).

The reason for being reset is because the bit location BITC is not needed at the time of a header. The configuration format analysis unit 211 accumulates a common bit length BITW stored in the data portion using the counter 305 so as to calculate a bit location BITC indicating an LSE location of a common effective bit to be subsequently extracted (waveform data). More specifically, a common bit length BITW of 5 bits and the previous bit location BITC are added to the bit location BITC, and carry is propagated to the address-in-block ADRC. By doing this, the bit location BITC is always in a range of 0 to 15, and the high order thereof indicates an address-in-block ADRC (word unit). That is to say, at the bit location BITC, since carry indicates that a common effective bit to be extracted (waveform data) exists in a subsequent address-in-block ADRC, the address-in-block ADRC is incremented.

In this way, in the processing of Step S1, an address-in-block ADRC is specified as an address of a data portion for respectively extracting information of a plurality of consecutive common effective bits in a block to be processed for processing of coded data.

FIG. 11 is a view showing an example of bit locations BITC showing each of the LSB locations of each common effective bit (waveform data) to be extracted, calculated by the counter 305 in Step S1.

At a data portion of a block, locations shown by arrows in FIG. 11 are bit locations BITC that are respectively obtained by the common bit lengths BITW being accumulated by the counter 305, i.e. LSB locations of common effective bits to be extracted for each time (waveform data).

In the example of FIG. 11, a common bit length BITW is 6 bits along with the example of FIG. 7.

In Step S2, the common effective bit extraction unit 212 extracts data (word unit) that is stored in an address-in-block ADRC specified by the processing of Step S1 from a data portion of a block to be decoded, and stores it as first read data in the register 306.

Simultaneously, the common effective bit extraction unit 212 transfers the data stored in the register 306 as the first read data previously to the register 307 as second read data.

The reason that the two registers 306 and 307 are provided in this way is because, as shown by the data format of each block constituting the coded data (see FIG. 7), there may be a case in which a common effective bit to be extracted (waveform data) is stored in a manner of being crossed over between two addresses.

The residual waveform data decompression unit 213 extracts data, the length of which corresponds to the bit number of the common bit length BITW, as a common effective bit (waveform data) from a position shown at the bit location BITC, among the data stored in the two registers 306 and 307, and further shifts so as to right-align it.

Then, the residual waveform data decompression unit 213 decompresses sampling residual data by duplicating and extending the highest bit of the common effective bit (waveform data), i.e. the coded bit S, to all of the higher bits and performing bit extension to a portion corresponding to the common erased portion.

FIG. 12 is a schematic view showing an outline of the processing of Step S2, i.e. processing of extracting a common effective bit until decompressing sampling residual data by performing bit extension.

Figure 12A:
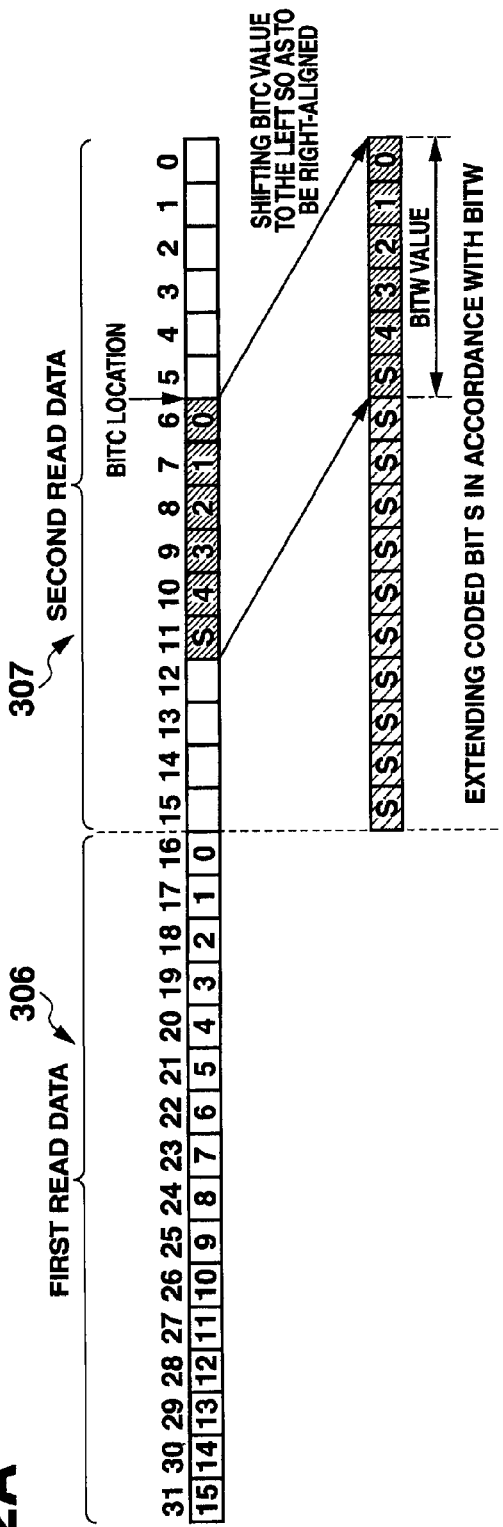
FIG. 12A is a schematic view showing an outline of processing from extracting a common effective bit until decompressing sampling residual data by performing bit extension, and a view showing an example of processing for case in which a common effective bit to be extracted is fit within a single register.

FIG. 12A is a view showing an example of processing for a case in which a common effective bit to be extracted is fit within the single register 306.

Figure 12B:
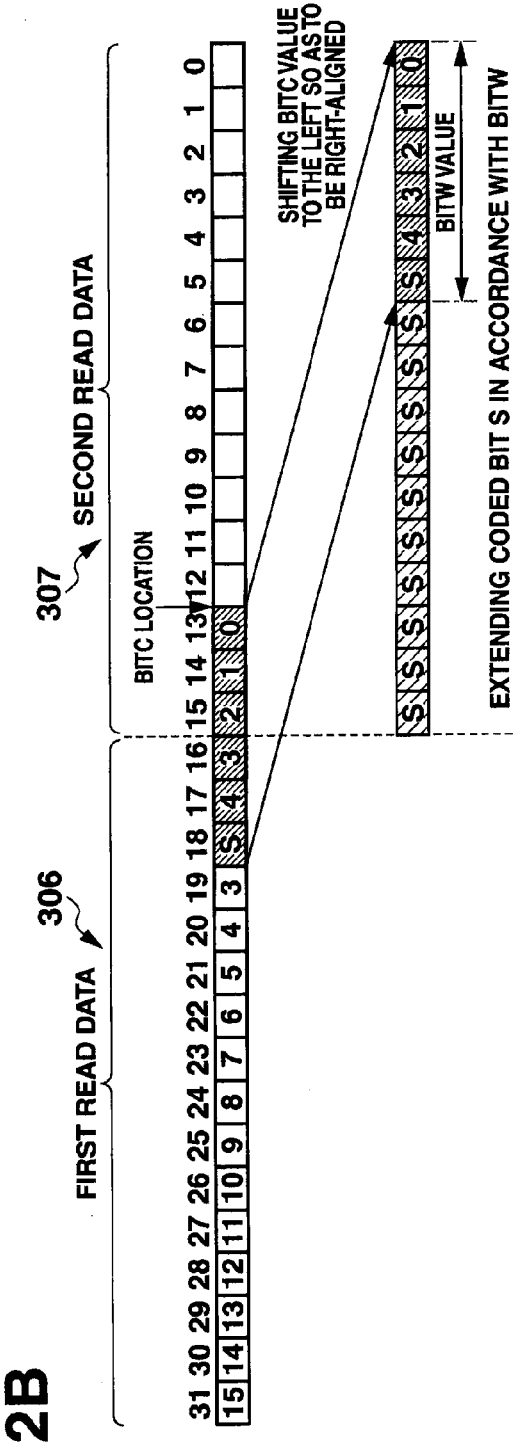
FIG. 12B is a schematic view showing an outline of processing from extracting a common effective bit until decompressing sampling residual data by performing bit extension, and a view showing an example of processing for a case in which a common effective bit to be extracted is fit within the two registers.

FIG. 12B is a view showing an example of processing for a case in which a common effective bit to be extracted is fit within the two registers 306 and 307.

In the example of FIG. 12A, the location of bit 6 of the register 307 is the bit location BITC. Therefore, the residual waveform data decompression unit 213 extracts data stored at each location of bit 6 to bit 11 of the register 307 as a common effective bit (waveform data). Here, the residual waveform data decompression unit 213 shifts the bit location BITC (shifts to the left) so that the common effective bit to be extracted (waveform data) is right-aligned.

Then, the residual waveform data decompression unit 213 decompresses sampling residual data by duplicating and extending the highest bit of the common effective bit (waveform data), i.e. the coded bit S, to all of the higher bits, i.e., by performing bit extension to a portion corresponding to the common erased portion.

In the example of FIG. 12B, the location of bit 13 of the register 307 is the bit location BITC. Therefore, the residual waveform data decompression unit 213 extracts a common effective bit (waveform data) by crossing over between the register 306 and the register 307. More specifically, the data stored in each location of bit 16 to bit 18 of the register 306 and in each location of bit 13 to bit 15 of the register 307 are extracted as a common effective bit (waveform data). Here, the residual waveform data decompression unit 213 shifts the bit location BITC (shifts to the left) so that the common effective bit to be extracted (waveform data) is right-aligned.

Then, the residual waveform data decompression unit 213 decompresses sampling residual data by duplicating and extending the highest bit of the common effective bi (waveform data), i.e. the coded bit S, to all of the higher bits, i.e., by performing bit extension to a portion corresponding to the common erased portion.

Referring back to FIG. 10, in Step S3, the inverse linear prediction processing unit 214 performs inverse linear prediction processing on the sampling residual data that is decompressed in the processing of Step S2 from the information of "compression mode" (originally stored in a header portion of a block) stored in the register 301 with reference to a parameter table of the memory (a table in which a compression mode is associated with an inverse linear prediction processing coefficient).

It should be noted that, since the details of the processing of Step S3 is described above with reference to FIG. 9 (the configuration in Step S3 of FIG. 10 is one schematically showing the configuration of FIG. 9, and thus similar), explanations thereof will be omitted here.

It also should be noted that, although omitted while explaining with reference to FIG. 9, the inverse linear prediction processing unit 214 outputs, as an output signal, sampling data of the PCM waveform data decompressed based on the information of "sound volume correction parameter" (originally stored in a header portion of a block) stored in the register 301 after adjusting sound volume.

By repeating the processing of Step S1 to Step S3 above, the respective sampling data of the PCM waveform data is sequentially output, and decoding of the PCM waveform data is realized in a real time manner.

In the case of the present embodiment which is configured as the electronic musical instrument 21, the abovementioned decoding processing is executed in a time-sharing manner with a plurality of channels, and performs signal processing such as pitch conversion, filter, envelope, and the like on a decoded output.

In this way, in the electronic musical instrument 21, it becomes possible to properly decode coded sound data so as to decrease the processing load on hardware as well as to maintain high-quality sound even when a waveform of a sound changes abruptly.

As described above, the musical sound generating device (the decoding device) 12 of the present embodiment includes the configuration format analysis unit 211, the common effective bit extraction unit 212, the residual waveform data decoding unit 213, and the inverse linear prediction processing unit 214.

In the musical sound generating device (decoding device) 12, a prediction residual value is calculated as sampling residual data by linear prediction processing using a prediction coefficient for respective sampling data of waveform data of sounds. A time-series assembly of the sampling residual data is generated as residual waveform data, an effective bit length is calculated for each set of sampling residual data of the residual waveform data, effective bit length data indicating the effective bit length of respective sampling residual data of the residual waveform data is generated. For the effective bit length data, with each effective bit length of a predetermined number of sets of sampling residual data as a processing target, a maximum effective bit length among processing targets is retrieved as a common effective bit length. Data in which a portion other than the common effective bit length has been erased from each of the predetermined number of sets of sampling residual data is generated as the information of plurality of common effective bits. And coded data which is data in which information of a plurality of common effective bits thus generated, information indicating a common effective bit length, and information indicating a prediction coefficient are at least arranged in a predetermined configuration format is used.

The configuration format analysis unit 211 analyzes the arrangement of information of a plurality of common effective bits, information indicating a common effective bit length, and information indicating a prediction coefficient from the configuration format of the coded data.

The common effective bit extraction unit 212 obtains information indicating a common effective bit length from an analysis result by the configuration format analysis unit 211 and extracts of the respective information of plurality of common effective bits based on the information indicating the common effective bit length.

The residual waveform data decompression unit 213 decompresses the residual waveform data by performing bit extension, which adds a portion other than the common effective bit length erased, to the respective information of the plurality of common effective bits extracted by the common effective bit extraction unit 212.

The inverse linear prediction processing unit 214 performs inverse linear prediction processing by the prediction coefficient specified from an analysis result by the configuration format analysis unit 211 on the residual waveform data decompressed by the residual waveform data decompression unit 213 so as to decode waveform data of the sounds.

As described above, the coded data to be decoded is data that does not leave data of constant bit length but leaves, as a common effective bit, data of a common effective bit length necessary for maintaining sound quality which changes depending on the variety of sounds or time positions. In this way, it becomes possible to lower a bit rate without deteriorating sound quality in coded data.

The musical sound generating device (decoding device) 12 thus can duplicate sounds as waveform data without deteriorating sound quality from the coded data, from which an amount of data of a redundant portion that exceeds such an effective bit length is erased.

In this way, it becomes possible to maintain high-quality sound even when a waveform of a sound changes abruptly, while decreasing the processing load on hardware.

Furthermore, the configuration format defines a block that is configured from the number of units determined in advance with a predetermined data length being a unit. The configuration format defines that the block is composed of a header portion in which information indicating the common effective bit length and the information indicating the prediction coefficient are stored and a data portion in which the respective information of the plurality of common effective bits is consecutively arranged in a time-series manner.

Furthermore, the decoded data is composed of a plurality of the blocks.

Furthermore, the common effective bit extraction unit 212 extracts, in every unit, data from the data portion of a block to be processed among the plurality of blocks, and extracts the respective information of the common effective bit by repeating the processing of extracting the common effective bit included in the data thus extracted.

Therefore, in the musical sound generating device (decoding device) 12, it is possible to decrease maintenance and load of capacity on a device side in order to allow each of the blocks constituting coded data to store information relating to decoding of a block, as well as being possible to decrease processing load in decoding processing for processing in a block unit.

Furthermore, the common effective bit extraction unit 212 includes data of two units extracted, and extracts the common effective bit included in at least one of the data of the two units. In this way, even in a case in which a failure such as crossing over between addresses occurred, the musical sound generating device (decoding device) 12 can extract a common effective bit without increasing processing load.

It should be noted that the present invention is not limited to the aforementioned embodiment, and that modifications, improvements, and the like within a scope that can achieve the object of the present invention are included in the present invention.

For example, although the storage capacity of a single block set in advance is 1024 bytes in the abovementioned embodiment, the present invention is not limited thereto, and it may be another byte number of a multiple of 2 such as 512 or 2048 bytes.

Furthermore, in the abovementioned embodiment, although the decoding device (the musical sound generating device) 12 to which the present invention is applied is explained using with an example of the electronic musical instrument 21 such as electronic piano that outputs a musical sound by a speaker or the like, the present invention is not limited thereto. For example, common electronic equipment having an information processing function that only performs decoding processing can be applied to the decoding device 12 (the musical sound generating device). More specifically, the decoding device 12 can be realized by a notebook-type personal computer, a desktop-type personal computer, a personal digital assistant, a mobile telephone, a portable game machine and the like, for example.

The aforementioned sequence of processing can be made to be executed by hardware, or can be made to be executed by software.

In other words, the functional configuration in FIG. 8 is merely an exemplification, and the present invention is not particularly limited thereto. More specifically, it is sufficient so long as the functions enabling execution of the aforementioned sequence of processing as a whole are imparted to the decoding device 12, and what kind of functional blocks are used in order to realize these functions are not particularly limited to the example of FIG. 8.

In addition, one functional block may be configured by a single piece of hardware, configured by a single piece of software, or may be configured by a combination of these.

In the case of having the sequence of processing executed by way of software, a program constituting this software is installed from the Internet or a recording medium into a computer or the like.

The computer may be a computer incorporating special-purpose hardware. In addition, the computer may be a computer capable of executing various functions by installing various programs, for example, a general-purpose personal computer.

The recording medium containing such a program may be configured not only by removable media that is distributed separately from the main body of the device in order to provide the program to the user, but also is configured by a recording medium provided to the user in a state incorporated in the main body of the equipment in advance, or the like. The removable media 31 is constituted by, for example, a magnetic disk (including floppy disks), an optical disk, a magneto-optical disk or the like. The optical disk is, for example, a CD-ROM (Compact Disk-Read Only Memory), DVD (Digital Versatile Disk), or the like. The magneto-optical disk is, for example, an MD (Mini-Disk), or the like. In addition, the recording medium provided to the user in a state incorporated with the main body of the equipment in advance is constituted by the memory 52 of FIG. 1 in which a program is recorded, a hard disk provided separately, or the like.

It should be noted that the steps describing the program recorded in the recording medium naturally include processing performed chronologically in the described order, but is not necessarily processed chronologically, and also includes processing executed in parallel or separately.

In addition, in the present specification, the term of system shall mean an overall device configured from a plurality of devices, a plurality of means (units), and the like.

Although several embodiments of the present invention have been explained in the foregoing, these embodiments are merely examples, and do not limit the technical scope of the present invention. The present invention can be attained by various other embodiments, and further, various modifications such as omissions and substitutions can be made in a scope not departing from the spirit of the present invention. These embodiments and modifications thereof are included in the scope and gist of the invention described in the present specification and the like, and are encompassed in the invention recited in the attached claims and equivalents thereof.

What is claimed is:

1. A coding device, comprising:
    a sampling residual data generator comprising a delay circuit for delaying sampling data inputted among PCM waveform of sound data, and a multiplier for multiplying the delayed sampling data by a linear prediction coefficient, the sampling residual data generator generating sampling residual data by subtracting the data multiplied by the multiplier from the inputted sampling data;
    an effective bit length data generator for calculating an effective bit length for the sampling residual data, and generating effective bit length data indicating the effective bit length of the sampling residual data;
    a common effective bit length retrieving unit for retrieving a maximum effective bit length as a common effective bit length, with each effective bit length of a predetermined number of sets of the sampling residual data as a processing target, for the effective bit length data generated by the effective bit length data generator, and generating, as a predetermined number of common effective actual data, data in which a portion other than the common effective bit length is erased from each of the predetermined number of sets of the sampling residual data; and
    a configuration format arranger for generating, as coded data, data in which the predetermined number of common effective actual data generated by the common effective bit length retrieving unit and information indicating the common effective bit length are at least arranged in a predetermined configuration format.

2. The coding device according to claim 1, further comprising:
    a memory that stores a standardization waveform number table in which a number of residual waveforms indicating a number of the common effective actual data that can be stored in a block of the configuration format are associated with each of various kinds of the common effective bit length,
    wherein the common effective bit length retrieving unit refers to the standardization waveform number table stored in the memory and selects the predetermined number of the common effective actual data included in the block based on the common effective bit length.

3. The coding device according to claim 2, wherein the block of the configuration format includes a data portion that arranges the predetermined number of the common effective actual data and a header portion that at least arranges information indicating the common effective bit length.

4. The coding device according to claim 2, wherein:
    the memory further stores a compression mode table that specifies a plurality of kinds of compression modes;
    the sampling residual data generator further generates a plurality of residual waveform data by using each of the plurality of kinds of compression modes, and selects a predetermined one among the plurality of residual waveform data;
    the effective bit length data generator and the common effective bit length retrieving unit perform processing, by setting one set of the residual waveform data selected by the sampling residual data generator as a processing target; and
    the configuration format arranger further arranges information indicating the compression mode used for the processing target in the predetermined configuration format, and generates the coded data.

5. A coding processing method executed by a coding device that codes sound data, the method comprising:
    a sampling residual data generating step of delaying sampling data inputted among PCM waveform of sound data, multiplying the delayed sampling data by a linear prediction coefficient, and generating sampling residual data by subtracting the multiplied data multiplied from the inputted sampling data;
    an effective bit length data generating step of calculating an effective bit length for the sampling residual data generated by the processing of the sampling residual data generating step, and generating effective bit length data indicating the effective bit length of the sampling residual data;
    a common effective bit length retrieving step of retrieving a maximum effective bit length as a common effective bit length, with each effective bit length of a predetermined number of sets of the sampling residual data as a processing target, for the effective bit length data generated by the processing of the effective bit length data generating step, and generating, as a predetermined number of common effective actual data, data in which a portion other than the common effective bit length is erased from each of the predetermined number of sets of the sampling residual data; and
    a configuration format arranging step of generating, as coded data, data in which the predetermined number of common effective actual data generated by the processing of the common effective bit length retrieving step and information indicating the common effective bit length are at least arranged in a predetermined configuration format.

6. A non-transitory computer readable storage medium having a program stored thereon that is executable to control a computer controlling a coding device that codes sound data to function as:
    a sampling residual data generator comprising a delay circuit for delaying sampling data inputted among PCM waveform of sound data, and a multiplier for multiplying the delayed sampling data by a linear prediction coefficient, the sampling residual data generator generating sampling residual data by subtracting the data multiplied by the multiplier from the inputted sampling data;
    an effective bit length data generator for calculating an effective bit length for the sampling residual data, and generating effective bit length data indicating the effective bit length of the sampling residual data;
    a common effective bit length retrieving unit for retrieving a maximum effective bit length as a common effective bit length, with each effective bit length of a predetermined number of sets of the sampling residual data as a processing target, for the effective bit length data generated by the effective bit length data generator, and generating, as a predetermined number of common effective actual data, data in which a portion other than the common effective bit length is erased from each of the predetermined number of sets of the sampling residual data; and a configuration format arranger for generating, as coded data, data in which the predetermined number of common effective actual data generated by the common effective bit length retrieving unit and information indicating the common effective bit length are at least arranged in a predetermined configuration format.

7. A decoding device, comprising:

a memory that stores coded data which is data in which information of a plurality of common effective bits, information indicating a common effective bit length, and information indicating a prediction coefficient that constitute sampling residual data calculated by linear prediction processing using the prediction coefficient for each set of sampling data of waveform data for sound, are at least arranged in a predetermined configuration format;

a configuration format analysis unit that analyzes the arrangement of the information of the plurality of common effective bits, the information indicating the common effective bit length, and the information indicating the prediction coefficient, from the configuration format of the coded data;

a common effective bit extraction unit for obtaining information indicating the common effective bit length from an analysis result by the configuration format analysis unit, and extracting the information of the plurality of common effective bits, respectively based on the information indicating the common effective bit length;

a residual waveform data decompression unit for decompressing residual waveform data by performing bit extension, which adds a portion other than the common effective bit length, to the information of the plurality of common effective bits extracted by the common effective bit extraction unit, respectively; and an inverse linear prediction processing unit for performing inverse linear prediction processing by the prediction coefficient specified from an analysis result by the configuration format analysis unit on the residual waveform data decompressed by the residual waveform data decompression unit, so as to decode waveform data for the sound.

8. The decoding device according to claim 7, wherein:

for the coded data, an effective bit length is calculated for each set of sampling residual data of the residual waveform data, and effective bit length data indicating the effective bit length of each set of the sampling residual data of the residual waveform data is generated; and for the effective bit length data, a maximum effective bit length among processing targets is retrieved as a common effective bit length, with each effective bit length of a predetermined number of sets of the sampling residual data as a processing target, and data, in which a portion other than the common effective bit length is erased from each of the predetermined number of sets of the sampling residual data, is generated as the information of the plurality of common effective bits.

9. The decoding device according to claim 7, wherein:

the configuration format defines a block that is configured from a number of units determined in advance, with a predetermined data length as a unit;

the configuration format defines that the block is composed of a header portion in which the information indicating the common effective bit length and the information indicating the prediction coefficient are stored, and a data portion in which the information of the plurality of common effective bits, respectively, are consecutively arranged in a time-series manner;

the decoded data is composed of a plurality of the blocks; and the common effective bit extraction unit extracts, for each of the units, data from the data portion of a block to be processed among the plurality of blocks, and extracts the information of a plurality of the common effective bit respectively, by repeating the predetermined number of times processing of extracting the common effective bit included in the extracted data.

10. The decoding device according to claim 9, wherein the common effective bit extraction unit retains the extracted data of two units, and extracts the common effective bit included in the data of at least one of the two units.

11. A decoding method executed by a decoding device that decodes waveform data for sound from coded data which is data in which information of a plurality of common effective bits, information indicating a common effective bit length, and information indicating a prediction coefficient that constitute sampling residual data calculated by linear prediction processing using a prediction coefficient for each set of sampling data of waveform data for sound, are at least arranged in a predetermined configuration format, the method comprising:

analyzing an arrangement of the information of the plurality of common effective bits, the information indicating the common effective bit length, and the information indicating the prediction coefficient, from the configuration format of the coded sound data;

obtaining information indicating the common effective bit length from an analysis result from the step of analyzing, and extracting the information of the plurality of common effective bits respectively based on the information indicating the common effective bit length;

decompressing residual waveform data by performing bit extension, which adds a portion other than the common effective bit length, to the information of the plurality of common effective bits, respectively, extracted in the step of extracting; and performing inverse linear prediction processing by the prediction coefficient specified from an analysis result from the step of analyzing on the residual waveform data decompressed by the step of decompressing, so as to decode waveform data for the sound.

12. The decoding method according to claim 11, wherein:

for the coded data, an effective bit length is calculated for each set of sampling residual data of the residual waveform data, and an effective bit length data indicating the effective bit length of each set of the sampling residual data of the residual waveform data is generated; and for the effective bit length data, a maximum effective bit length among processing targets is retrieved as a common effective bit length, with each effective bit length of a predetermined number of sets of the sampling residual data as a processing target, and data, in which a portion other than the common effective bit length is erased from each of the predetermined number of sets of sampling residual data, is generated as the information of the plurality of common effective bits.

13. The decoding method according to claim 11, wherein:

the configuration format defines a block that is configured from a number of units determined in advance with a predetermined data length as a unit;

the configuration format defines that the block is composed of a header portion in which the information indicating the common effective bit length and the information indicating the prediction coefficient are stored, and a data portion in which the information of the plurality of common effective bits, respectively, are consecutively arranged in a time-series manner;

the decoded data is composed of a plurality of the blocks; and in the step of extracting, for each of the units, data from the data portion of a block to be processed among the plurality of blocks is extracted, and the information of a plurality of the common effective bits respectively are extracted, by repeating the predetermined number of times processing of extracting the common effective bit included in the extracted data.

14. The decoding method according to claim 13, further comprising:

retaining the extracted data of two units, and extracting the common effective bit included in the data of at least one of the two units.

15. A non-transitory computer readable storage medium having a program stored thereon for enabling a computer, which controls a decoding device that decodes waveform data for sound from coded data which is data in which information of a plurality of common effective bits, information indicating a common effective bit length, and information indicating a prediction coefficient that constitute sampling residual data calculated by linear prediction processing using the prediction coefficient for each set of sampling data of waveform data for sound, are at least arranged in a predetermined configuration format, to execute functions comprising:

a configuration format analysis step of analyzing the arrangement of the information of the plurality of common effective bits, the information indicating the common effective bit length, and the information indicating the prediction coefficient from the configuration format of the coded sound data;

a common effective bit extraction step of obtaining information indicating the common effective bit length from an analysis result from the configuration format analysis step, and extracting the information of the plurality of common effective bits, respectively, based on the information indicating the common effective bit length;

a residual waveform data decompression step of decompressing residual waveform data by performing bit extension, which adds a portion other than the common effective bit length, to the information of the plurality of common effective bits, respectively, extracted in the common effective bit extraction step; and an inverse linear prediction processing step of performing inverse linear prediction processing by the prediction coefficient specified from an analysis result from the configuration format analysis unit, on the residual waveform data decompressed in the residual waveform data decompression step, so as to decode waveform data for the sound.

16. The non-transitory computer readable storage medium according to claim 15, wherein:

for the coded data, an effective bit length is calculated for each set of sampling residual data of the residual waveform data, and an effective bit length data indicating the effective bit length of each set of the sampling residual data of the residual waveform data is generated; and for the effective bit length data, a maximum effective bit length among processing targets is retrieved as a common effective bit length, with each effective bit length of a predetermined number of sets of the sampling residual data as a processing target, and data, in which a portion other than the common effective bit length is erased from each of the predetermined number of sets of sampling residual data, is generated as the information of the plurality of common effective bits.

17. The non-transitory computer readable storage medium according to claim 15, wherein:

the configuration format defines a block that is configured from a number of units determined in advance, with a predetermined data length as a unit;

the configuration format defines that the block is composed of a header portion in which the information indicating the common effective bit length and the information indicating the prediction coefficient are stored, and a data portion in which the information of the plurality of common effective bits, respectively, are consecutively arranged in a time-series manner;

the decoded data is composed of a plurality of the blocks; and in the common effective bit extraction step, for each of the unit, data from the data portion of a block to be processed among the plurality of blocks is extracted, and the information of a plurality of the common effective bits respectively are extracted, by repeating the predetermined number of times processing of extracting the common effective bit included in the extracted data.

18. The non-transitory computer readable storage medium according to claim 17, wherein in the common effective bit extraction step, the extracted data of two units is retained, and the common effective bit included in the data of at least one of the two units is extracted.

* * * * *